(12) United States Patent
Neudecker et al.

(10) Patent No.: US 10,080,291 B2
(45) Date of Patent: Sep. 18, 2018

(54) PRINTED CIRCUIT BOARD WITH INTEGRATED THIN FILM BATTERY

(71) Applicant: Sapurast Research LLC, Wilmington, DE (US)

(72) Inventors: Bernd J. Neudecker, Littleton, CO (US); Joseph A. Keating, Broomfield, CO (US)

(73) Assignee: SAPURAST RESEARCH LLC, Wilmington, DE (US)

( * ) Notice: Subject to any disclaimer, the term of this patent is extended or adjusted under 35 U.S.C. 154(b) by 0 days.

(21) Appl. No.: 15/347,705

(22) Filed: Nov. 9, 2016

(65) Prior Publication Data

US 2017/0064836 A1    Mar. 2, 2017

Related U.S. Application Data

(62) Division of application No. 14/081,964, filed on Nov. 15, 2013, now Pat. No. 9,532,453, which is a division
(Continued)

(51) Int. Cl.
*H05K 1/18*    (2006.01)
*H05K 1/11*    (2006.01)
(Continued)

(52) U.S. Cl.
CPC .............. *H05K 1/185* (2013.01); *H01M 6/40* (2013.01); *H01M 10/0436* (2013.01); *H01M 10/425* (2013.01); *H05K 1/0313* (2013.01); *H05K 1/16* (2013.01); *H01M 2220/30* (2013.01); *H05K 2201/10037* (2013.01); *H05K 2201/2036* (2013.01)

(58) Field of Classification Search
CPC ........ H05K 1/16; H05K 1/185; H05K 1/0313; H05K 2201/10037; H05K 2201/2036; H01M 10/425; H01M 10/0436; H01M 2220/30; H01M 6/40
See application file for complete search history.

(56) References Cited

U.S. PATENT DOCUMENTS 4,328,297 A    5/1982 Bilhorn
4,395,713 A    7/1983 Nelson et al.
(Continued)

FOREIGN PATENT DOCUMENTS

DE    10252308    4/2004
DE    19627543    10/2004
(Continued)

OTHER PUBLICATIONS

Infinite Power Solutions, Final Office Action dated Mar. 23, 2016 for U.S. Appl. No. 14/081,964.
(Continued)

*Primary Examiner* — Hoa C Nguyen
(74) *Attorney, Agent, or Firm* — Young Basile Hanlon & MacFarlane, P.C.

(57) ABSTRACT

The present invention relates to, for example, printed circuit boards having a thin film battery or other electrochemical cell between or within its layer or layers. The present invention also relates to, for example, electrochemical cells within a layer stack of a printed circuit board.

9 Claims, 9 Drawing Sheets

Related U.S. Application Data of application No. 12/873,953, filed on Sep. 1, 2010, now Pat. No. 8,599,572.

(60) Provisional application No. 61/238,889, filed on Sep. 1, 2009.

(51) Int. Cl.

| | |
|---|---|
| *H01M 6/40* | (2006.01) |
| *H01M 10/04* | (2006.01) |
| *H01M 10/42* | (2006.01) |
| *H05K 1/16* | (2006.01) |
| *H05K 1/03* | (2006.01) |

(56) References Cited

U.S. PATENT DOCUMENTS

| | | | |
|---|---|---|---|
| 5,035,965 A | 7/1991 | Sangyoji et al. | |
| 5,147,985 A | 9/1992 | DuBrucq | |
| 5,153,710 A | 10/1992 | McCain | |
| 5,180,645 A | 1/1993 | More | |
| 5,262,254 A | 11/1993 | Koksbang et al. | |
| 5,302,474 A | 4/1994 | Shackle et al. | |
| 5,401,688 A | 3/1995 | Yamaji et al. | |
| 5,464,692 A | 11/1995 | Huber | |
| 5,637,418 A * | 6/1997 | Brown | H01M 2/0207 429/127 |
| 6,013,949 A | 1/2000 | Tuttle | |
| 6,045,942 A * | 4/2000 | Miekka | H01M 6/40 429/124 |
| 6,137,671 A | 10/2000 | Staffiere | |
| 6,156,452 A | 12/2000 | Kozuki et al. | |
| 6,264,709 B1 | 7/2001 | Yoon et al. | |
| 6,285,492 B1 * | 9/2001 | Good | H01M 6/30 359/297 |
| 6,379,846 B1 | 4/2002 | Terahara et al. | |
| 6,396,001 B1 | 5/2002 | Nakamura | |
| 6,480,699 B1 | 11/2002 | Lovoi | |
| 6,541,147 B1 | 4/2003 | McLean et al. | |
| 6,569,570 B2 | 5/2003 | Sonobe et al. | |
| 6,608,464 B1 | 8/2003 | Lew et al. | |
| 6,621,012 B2 | 9/2003 | Crockett et al. | |
| 6,642,895 B2 | 11/2003 | Zurcher et al. | |
| 6,730,423 B2 | 5/2004 | Einhart et al. | |
| 6,838,209 B2 | 1/2005 | Langan et al. | |
| 6,890,385 B2 | 5/2005 | Tsuchiya et al. | |
| 6,983,535 B2 | 1/2006 | Crockett et al. | |
| 7,045,246 B2 | 5/2006 | Simburger et al. | |
| 7,188,410 B2 | 3/2007 | Crockett et al. | |
| 7,466,274 B2 | 12/2008 | Lin et al. | |
| 7,848,715 B2 | 12/2010 | Boos | |
| 7,858,223 B2 | 12/2010 | Visco et al. | |
| 8,010,048 B2 | 8/2011 | Brommer et al. | |
| 8,056,814 B2 | 11/2011 | Martin et al. | |
| 2001/0005561 A1 | 6/2001 | Yamada et al. | |
| 2001/0032666 A1 | 10/2001 | Jenson et al. | |
| 2002/0037756 A1 | 3/2002 | Jacobs et al. | |
| 2002/0071989 A1 | 6/2002 | Verma et al. | |
| 2002/0110733 A1 | 8/2002 | Johnson | |
| 2003/0030589 A1 | 12/2003 | Zurcher et al. | |
| 2004/0106045 A1 | 6/2004 | Ugaji | |
| 2005/0079418 A1 | 4/2005 | Kelley et al. | |
| 2005/0170736 A1 | 8/2005 | Cok | |
| 2005/0271796 A1 | 12/2005 | Neudecker et al. | |
| 2006/0231837 A1 | 10/2006 | Wuchse et al. | |
| 2007/0037058 A1 | 2/2007 | Visco et al. | |
| 2007/0229228 A1 | 10/2007 | Yamazaki et al. | |
| 2007/0264564 A1 | 11/2007 | Johnson et al. | |
| 2008/0084678 A1 | 4/2008 | Burhance et al. | |
| 2008/0150829 A1 | 6/2008 | Lin et al. | |
| 2008/0318101 A1 | 12/2008 | Kim et al. | |
| 2009/0041994 A1 | 2/2009 | Ockenfuss | |
| 2009/0092903 A1 | 4/2009 | Johnson et al. | |
| 2009/0123420 A1 | 5/2009 | Meskens | |
| 2009/0185357 A1 * | 7/2009 | Rendek, Jr. | H01H 13/704 361/762 |
| 2009/0308936 A1 | 12/2009 | Nitzan et al. | |
| 2009/0312069 A1 | 12/2009 | Peng et al. | |

FOREIGN PATENT DOCUMENTS

| | | |
|---|---|---|
| JP | H02-121383 | 5/1990 |
| JP | A-H11-274735 | 10/1999 |
| JP | 2000251868 | 9/2000 |
| JP | 2004165562 | 6/2004 |
| JP | 200556761 | 3/2005 |
| WO | WO-2004093223 | 10/2004 |

OTHER PUBLICATIONS

Infinite Power Solutions, Inc., Non final office action for U.S. Appl. No. 14/081,964, (dated Jul. 22, 2015).

Infinite Power Solutions, Inc., Japanese first office action for Application No. 2014-041002, (dated Feb. 2, 2015).

Korean Office Action, dated Feb. 20, 2017, Korean Application No. 10-2012-7008146.

* cited by examiner

PRINTED CIRCUIT BOARD WITH INTEGRATED THIN FILM BATTERY

RELATED APPLICATIONS

This application is a divisional of pending U.S. patent application Ser. No. 14/081,964 filed on Nov. 15, 2013, which is a divisional of pending U.S. patent application Ser. No. 12/873,953 filed on Sep. 1, 2010, which issued as U.S. Pat. No. 8,599,572 on Dec. 3, 2013, which claims priority to provisional patent application No. 61/238,889, Sep. 1, 2009, entitled, "PRINTED CIRCUIT BOARD WITH INTEGRATED THIN FILM BATTERY", which is expressly incorporated fully herein by reference.

TECHNICAL FIELD

The field of this invention is a printed circuit board containing solid-state, thin-film secondary and primary electrochemical devices, including, for example, batteries, between and/or within its layers.

BACKGROUND

Typical electrochemical devices comprise, for example, multiple electrically active layers such as an anode, a cathode, an electrolyte, a substrate and current collectors. Some layers, such as, for example, an anode layer comprising lithium, are comprised of materials that are very environmentally sensitive. The substrate may, for example, not be a separate battery element but instead may be provided by a semiconducting surface or a conductive or insulating packaging surface of a semiconductor device or printed circuit board (PCB) to which the battery is attached. Such batteries require an encapsulation to protect the environmentally sensitive material. Some schemes encapsulate the sensitive layers of electrochemical devices, such as encapsulation with gold foil. Other schemes encapsulate the device with a pouch made of metal and plastic, for example, that seals around the perimeter of the device.

The applicants' earlier filed patents and patent applications provide certain battery and encapsulation designs and techniques, including U.S. Pat. No. 6,916,679 and U.S. Published Patent Applications US 2006/286448 A1, US 2007/184345 A1, US 2007/202395 A1, US 2007/264564 A1, US 2008/261107 A1, US 2008/0286651, and U.S. Patent App Ser. No. 61/179,953, which are herein incorporated by reference in their entirety. These patents and applications provide, for example, types of batteries that, when incorporated with a printed circuit board, may provide a benefit.

Space on the surface of a printed circuit board (PCB), rigid or flexible, is very limited and is thus at a premium. Therefore, there is a need to incorporate electrochemical cells, such as batteries, with the design of PCBs more efficiently, to save and better utilize the PCB surface space.

SUMMARY

The various embodiments of the present invention improve upon the prior art and other various art by improving the practicality of implementing a combined electrochemical cell, such as a thin film battery, in combination with products such as a semiconductor device or a PCB. In certain exemplary embodiments of the present invention a fully encapsulated and preferably heat, pressure and moisture resilient cell may be incorporated within a PCB. The PCB and cell may be integrated to allow the cell to withstand the stressful environments in which it may be exposed during PCB fabrication. Various embodiments provide internal and/or external access to the cell via gaps, voids, pockets, spaces or other designs.

In certain exemplary embodiments of the present invention, electrochemical devices may be incorporated into PCBs or semiconductor devices in their fully encapsulated state. However, the integration of an electrochemical device into a PCB protects the electrochemical device against physically, chemically, and biologically harmful environments. Furthermore, integration of an electrochemical device into a PCB may add more functionality to the PCB and may render the PCB more valuable as a basic power-equipped electronic building block for many electronic applications.

In certain exemplary embodiments of the present invention, one can save space on the PCB surface by inserting electronic modules and components, such as electrochemical cells, including thin-film batteries, into a printed circuit board instead of, for example, on the surface of a PCB as disclosed, for example, in U.S. patent application Ser. No. 11/748,471.

One may also consider that using the PCB three-dimensionally, or in other words integrating an electrochemical device into a PCB instead of attaching the electronic device to the surface of the PCB, increases the functional electronic density per unit footprint.

Inserting electronic modules and components into the PCB may also be advantageous by, for example, limiting the total cross-sectional thickness of the functionalized or loaded PCBs. Limiting the thickness of the PCBs may be preferred, for example, for geometrical reasons, because some applications of integrated PCBs have limited volume and thickness. Limiting the thickness of the PCBs may also be preferred for mechanical reasons, for example, to reduce the momentum of a mechanical body in conjunction with vibration, centrifugal forces and acceleration, among others and instead place the given mass of that body closer to its center of gravity. For example, lengthy capacitors (that have a long height axis in comparison to their diameter because, for example, of their long terminal feet) mounted onto PCBs may be sensitive to long-term vibration that may cause the capacitors to be electrically disconnected from the PCB.

Inserting an electronic component into, rather than onto, a PCB may increase the robustness of this electronic component against external chemical, physical and biological factors. For example, the PCB surrounding an electronic component may serve as an added encapsulation or protection layer against high humidity, moisture, water, oxygen, corrosion by acids and bases, solvents, UV radiation, temporary extreme (high or low) temperatures, scratching objects, mechanical shock and micro-organism attack.

Additionally, providing an electrochemical cell or thin-film battery to connect to an electronic circuit already inserted into a PCB may simplify the production of this type of electronic component and prevent human error in attaching or soldering electronic components to PCBs. Therefore, a PCB with integrated electrochemical cell or thin-film battery may be used as a basic, power source equipped building block for electronic circuitry that simplifies and compacts consumer and mini/micro-electronics.

The goal of certain exemplary embodiments of the present invention, for example, is to avoid limiting the lateral extension of the electrochemical cell embedded in a PCB to only a sub-region of the PCB surface. Instead the cell may, for example, extend beyond the edges of the PCB as shown in the drawings. This extension may, for example, provide easy access to a contact or contact region of the cell.

Another goal of certain exemplary embodiments of the present invention is to embed a cell into a PCB with, for example, at least one electrically conducting layer above or below the cell, as opposed to using a PCB with all electrically insulating layers, as shown in certain exemplary figures. An embodiment, for example, that includes a battery with a metal substrate terminal and metal encapsulation terminal may be preferred over a design that includes insulating layers above and below an energy cell, such as a thin film battery.

Another goal of certain exemplary embodiments of the present invention is to avoid the need to fill in any potential gaps around the embedded cell and instead, for example, allow void space in that region. This void may, for example, allow access or contact with the cell or certain portions of the cell.

Yet another goal of certain exemplary embodiments of the present invention is to avoid requiring a printed circuit board structure using multiple electrically insulating layers to embed the cell. Instead, for example, the cell may be embedded in a single-layer printed circuit board. This embodiment may be preferred because, for example, it may be simplified and thinner than other embodiments.

There are many benefits to, for example inserting a cell or thin-film battery into a PCB. First, there are architectural benefits that protect the cell against certain chemical, physical and biological impact factors. Second, such a technique may be more cost-effective than providing the PCB and the electrochemical cell or thin-film battery as separate items wherein a customer in the product fabrication or integration chain would be able to attach the electrochemical cell or thin-film battery only at the surface of the PCB.

An exemplary embodiment of the present invention includes a printed circuit board comprising a layer stack having two electrically insulating layers comprising conductor traces, wherein each of said electrically insulating layers having a perimeter and an electrochemical cell inserted between said layers wherein a portion of said electrochemical cell extends laterally beyond the perimeter of one of said insulating layers.

Another exemplary embodiment of the present invention includes a printed circuit board comprising a layer stack having two electrically insulating layers including conductor traces and an electrically conducting layer and an electrochemical cell inserted in said layer stack wherein said electrochemical cell is embedded between said electrically conducting layer and electrically insulating layers of said layer stack.

Another exemplary embodiment of the present invention includes a printed circuit board comprising a layer stack having a plurality of, for example two, electrically insulating layers including conductor traces, a plurality of, for example two, electrically conducting layers and an electrochemical cell inserted in said layer stack wherein said electrochemical cell is embedded between said electrically conducting layers.

Another exemplary embodiment of the present invention includes a printed circuit board comprising a layer stack having a plurality of, for example two, electrically insulating layers including conductor traces, an electrochemical cell inserted in said layer stack and a gap located at an edge of said electrochemical cell.

Another exemplary embodiment of the present invention includes a printed circuit board comprising one electrically insulating layer including conductor traces and an electrochemical cell located within the interior of said electrically insulating layer.

Another exemplary embodiment of the present invention includes a battery fabricated between the layers of, for example, a PCB. The battery may, for example, include a first electrical contact, a bonding layer coupled with the first electrical contact and a first embedded conductor, at least one battery cell structure in selective electrical contact with the first electrical contact via the first embedded conductor, which may be formed or disposed within a PCB.

The bonding layer coupled with the PCB may have more than one conductor, such as an optional, second embedded conductor, which in turn creates an optional, selective electrical contact of the PCB with said first electrical contact. The bonding layer and the at least one battery cell structure may be sandwiched within a PCB.

The first electrical contact may include, for example, an encapsulate metal. The bonding layer may be an adhesive material, an insulating material, a plastic, a polymeric material, glass and/or fiberglass. An insulating reinforcement layer may be embedded within the bonding layer. Such a reinforcement layer may be selectively conductive. The conductor may be, for example, a tab, a wire, a metal strip, a metal ribbon, multiple wires, multiple metal strips, multiple metal ribbons, a wire mesh, perforated metal, a metal coating applied to the adhesive layer or a disk. The conductor may be woven within the bonding layer and the bonding layer may include a slit within which the embedded conductor is woven.

The battery cell structure may include an anode, an electrolyte, a cathode and a barrier layer. The cathode may, for example, not be annealed at all, annealed at lower temperatures or annealed at higher temperatures by using convection furnaces, rapid thermal anneal methods or by a laser annealing and/or crystallization process.

Another exemplary embodiment of the present invention includes a method of manufacturing a thin film battery comprising, in no particular order, the steps of creating a selectively conductive bonding layer, coupling the bonding layer with a first contact layer, coupling a first side of a battery cell structure within a pocket formed in, for example, a PCB, and coupling the battery cell structure with the PCB. Optionally, the bonding layer may be made selectively conductive at an additional location at which the selectively conductive bonding layer creates an electrical contact between the first contact layer and the PCB. Yet another exemplary embodiment of the present invention includes a method of manufacturing a thin film battery comprising, in no particular order, the steps of creating a selectively conductive bonding layer, coupling the bonding layer with a first contact layer, coupling a first side of a battery cell with the first contact layer as well, coupling the bonding layer with an interior surface within a PCB, and coupling a second side of the battery cell structure with the bonding layer.

Examples of this exemplary embodiment may include creating a battery cell structure with anode, cathode and electrolyte layers, embedding at least one conductor within the bonding layer, weaving at least one conductive wire through the bonding layer wherein selective portions of the conductive wire are exposed, heating the bonding layer and compressing the conductor within the bonding layer, and insulating the battery with an insulating material. This exemplary embodiment may include providing an insulating reinforcement layer embedded within the bonding layer. The reinforcement layer may be selectively conductive.

Yet another exemplary embodiment of the present invention includes a battery within, for example, a PCB wherein the first side of the battery cell structure is at least in direct mechanical contact with an interior surface of the PCB. This exemplary embodiment includes a first electrical contact, a bonding layer coupled with a first electrical contact and a first embedded conductor, at least one battery cell structure in selective electrical contact with the first electrical contact via the first embedded conductor, the bonding layer coupled with the first electrical contact and comprising a second embedded conductor that is in selective electrical contact with the first electrical contact and the printed circuit board. The bonding layer and the at least one battery cell structure are sandwiched between the first contact layer and within a PCB.

Another exemplary embodiment of the present invention includes a battery within, for example, a PCB wherein the battery cell structure is mechanically separated by at least the bonding layer (and not in direct mechanical contact with the interior PCB surfaces). The exemplary embodiment includes a first electrical contact, a bonding layer coupled with the first electrical contact and a first embedded conductor, at least one battery cell structure in selective electrical contact with the first electrical contact via said first embedded conductor, the bonding layer coupled with the PCB and having an optional, second embedded conductor in the bonding layer, which in turn creates an optional, selective electrical contact of the PCB with the first electrical contact. The bonding layer and the at least one battery cell structure are sandwiched between the first contact layer and an interior surface of a PCB.

In another exemplary embodiment of the present invention, a method of manufacturing a thin film battery includes creating a selectively conductive bonding layer, coupling the bonding layer with a first contact layer, coupling a first side of a battery cell structure with an interior surface of a layer of for example, a PCB and coupling a second side of the battery cell structure with the bonding layer.

In yet another exemplary embodiment of the present invention, a method of manufacturing a thin film battery includes creating a selectively conductive bonding layer, coupling the bonding layer with a first contact layer, coupling a first side of a battery cell structure with the first contact layer, coupling a second side of the battery cell structure with the selectively conductive bonding layer and coupling the bonding layer within the layers of, for example, a PCB.

Another exemplary embodiment of the present invention includes an electrical connection between the battery cell and the PCB. The electrical connection between the battery cell and the interior surfaces of layers within, for example, a PCB can be made by direct physical contact or by wire bonding.

In another exemplary embodiment of the present invention, prior to its integration within the PCB or conductive or insulating surface within a PCB, the battery may be fabricated as a discrete device and then integrated as a whole together with its substrate and its encapsulation inside of the semiconducting device.

Another embodiment of the present invention includes the electrical connection between a multi-battery cell stack within the PCB through the interior of the PCB to the surface of the PCB.

DETAILED DESCRIPTION

The present invention is not limited to the particular methodology, compounds, materials, manufacturing techniques, uses, and applications described herein, as these may vary. The terminology used herein is used for the purpose of describing particular embodiments only, and is not intended to limit the scope of the present invention. The singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures.

All patents and other publications identified are incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason.

Figure 1A:
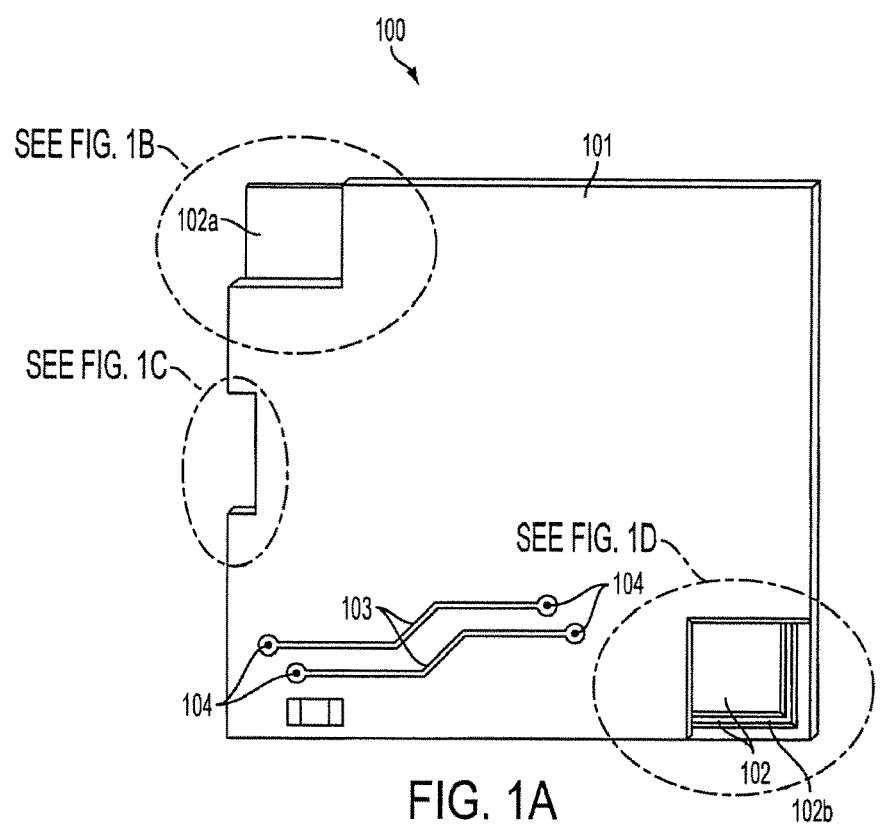
FIG. 1A shows a top down view of an exemplary embodiment of the present invention including an electrochemical cell that is embedded in a PCB with an edge of the cell extending beyond the edge of the PCB.
Figure 1B:
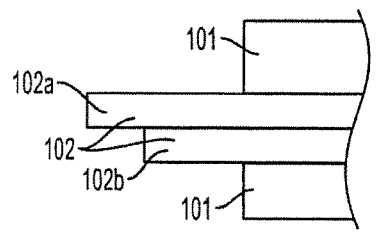
FIG. 1B shows an expanded side cross-sectional view of a portion of an exemplary embodiment of the present invention including an electrochemical cell that is embedded in a PCB with an edge of the cell extending beyond the edge of a PCB.
Figure 1C:
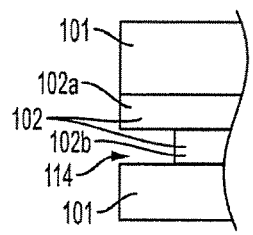
FIG. 1C shows an expanded side cross-sectional view of a portion of an exemplary embodiment of the present invention including an electrochemical cell that is embedded in a PCB with a portion of the PCB removed to form a gap or space.
Figure 1D:
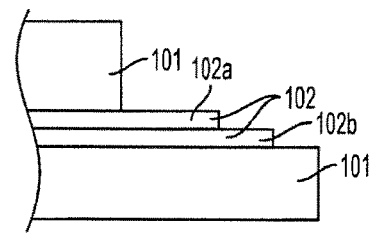
FIG. 1D shows an expanded side cross-sectional view of a portion of an exemplary embodiment of the present invention including an electrochemical cell that is embedded in a PCB with a portion of the PCB removed to expose a portion of the cell.

FIGS. 1A, 1B, 1C and 1D show various alternative exemplary embodiments of the present invention, device 100. FIG. 1A shows a top down view of exemplary device 100 including an electrochemical cell 102 embedded in printed circuit board (PCB) 101 with an edge of cell 102 extending beyond the edge of PCB 101. PCB 101 or other exemplary embodiments of the present invention may include a stack of multiple, for example two, three, four, five, six, seven, eight or more, layers. For example, as shown in FIG. 1A, PCB 101 includes two layers. Electrochemical cell 102 may also have multiple layers. For example, as shown in FIG. 1A, electrochemical cell 102 includes two layers, top layer 102a and bottom layer 102b. Top layer 102a may be, for example, the positive terminal of electrochemical cell 102 and bottom layer 102b may be, for example, the negative terminal of electrochemical cell 102. In another exemplary embodiment of the present invention, top layer 102a may be, for example, the negative terminal of electrochemical cell 102 and bottom layer 102b may be, for example, the positive terminal of electrochemical cell 102. FIG. 1B shows an expanded side view of device 100 including cell 102 extending beyond the edge of PCB 101. PCB 101 may be constructed, at least in part, from flame retardant 4 (FR4) or other PCB layer materials known in the art, such as, for example, polytetrafluoroethylene, FR-1, CEM-1 (cotton paper and epoxy), CEM-2 (cotton paper and epoxy), CEM-3 (woven glass and epoxy), CEM-4 (woven glass and epoxy), CEM-5 (woven glass and polyester), FR-2 (phenolic cotton paper), FR-3 (cotton paper and epoxy), FR-5 (woven glass and epoxy), FR-6 (matte glass and polyester), G-10 (woven glass and epoxy) and/or polyimide such as, for example, Kapton®. PCB 101 may include conducting traces 103 on one or both outer surfaces of the PCB. Conducting traces 103 may be constructed of for example, Cu foil. Conducting traces 103 may be included on a surface mount, such as a single surface mount, as shown in FIG. 1A. FIG. 1C shows another exemplary expanded side view of device 100 including a portion of PCB 101 removed to form a gap 114 in PCB 101. FIG. 1D shows an expanded view of device 100 including PCB 101 with a portion removed to expose a portion of cell 102. FIGS. 1B, 1C and 1D also show electrochemical cell 102 with multiple, for example two, layers. However, exemplary embodiments of the present invention may also include an electrochemical cell with more than two, for example three, four, five, six, seven, eight or more, layers. Furthermore, exemplary embodiments shown in FIGS. 1A, 1B, 1C and 1D may also include multiple, for example two, three, four, live, six, seven, eight or more, electrochemical cells.

Figure 2:
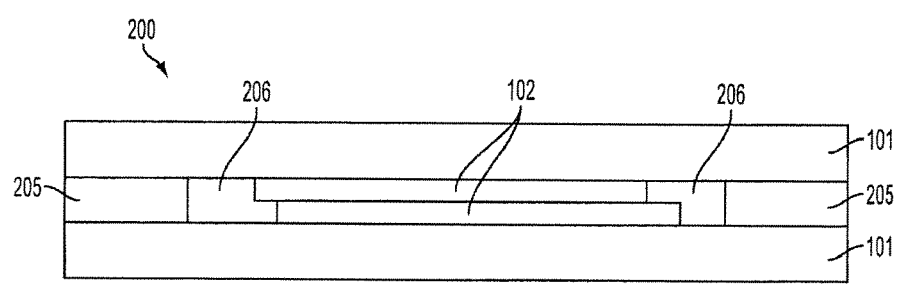
FIG. 2 depicts a side cross-sectional view of an embodiment of the present invention including a three layer PCB including an electrochemical cell with a pocket on both sides of the embedded electrochemical cell.

FIG. 2 shows device 200, a side cross-sectional view of an exemplary embodiment of the present invention, including a three-layer PCB 101 with pockets 206. Pockets 206 have gaps of space on the sides of electrochemical cell 102 that may be embedded in insulating FR4 layers. Pockets 206 may be on one or more sides of embedded electrochemical cell 102. PCB 101 may include traces and/or components on one or both outer sides of PCB 101. Spacers 205 make up a portion of PCB 101 and connect the top layer of PCB 101 to the bottom layer of PCB 101. Spacers 205 may further define and/or provide support and stability to device 200. Pockets 206 may, for example, reduce stresses within the assembly, provide a buffer region, provide a place for other components or design features and/or provide capacity for thermal controls.

Figure 3:
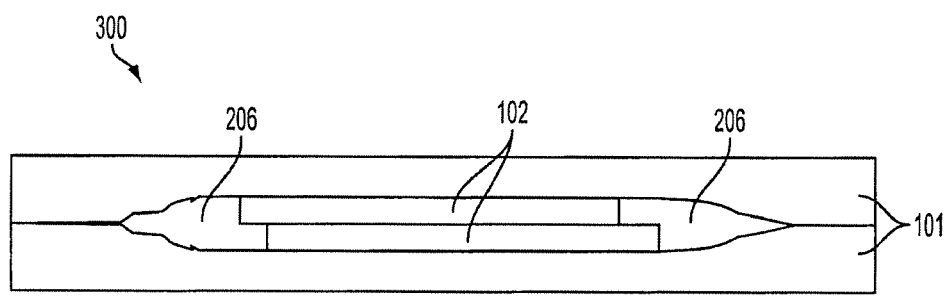
FIG. 3. depicts a side cross-sectional view of an exemplary embodiment of the present invention including a multi-layer PCB including an embedded electrochemical cell with a pocket on both sides of the embedded electrochemical cell.

FIG. 3 shows an exemplary embodiment of the present invention including alternate PCB 101 and pocket 206 structures. PCB 101 may include two layers, which are wrapped around electrochemical cell 102. Therefore, the inside of the two layers of PCB 101 have a curved structure, causing pockets 206 to include a similarly curved exterior shape. Furthermore, as shown in FIG. 3, electrochemical cell 102 may be thinner than a layer of PCB 101 or thinner than the combination of multiple layers of PCB 101. However, according to alternate exemplary embodiments of the present invention, electrochemical cell 102 may be thicker than a layer of PCB 101, thicker than the combination of multiple, for example two, three, four, five, six, seven, eight or more, layers of PCB 101 or about the same thickness as one or multiple layers of PCB 101.

Figure 4:
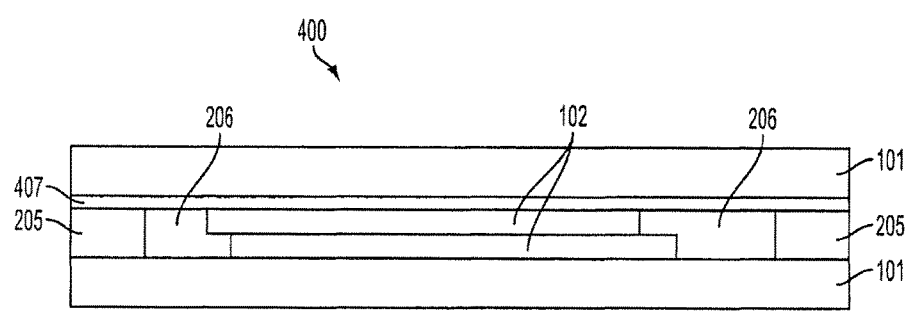
FIG. 4 shows a side cross-sectional view of an exemplary embodiment of the present invention including a conducting layer between the electrochemical cell and either the top of bottom insulating layer of the PCB.

FIG. 4 shows device 400, an exemplary embodiment of the present invention that includes, for example, a conductive surface with a conductive contact pad, a conductive line, a conductive via or another conductive layer. A conductive surface also may be formed together with an insulating surface, such as a PCB, where the conductive surface may be formed on an inner layer of the PCB. FIG. 4 shows, for example, embedded conductor 407 embedded within or on an interior insulating FR4 layer. Embedded conductor 407 may be externally accessible at the edge of PCB 101. Embedded conductor 407 may not extend all the way to the edge of PCB 101 and therefore function, for example, as a PCB internal electrical interconnect. Embedded conductor 407 may function, for example, as a selectively conductive bonding layer. A selectively conductive bonding layer may, for example, permit conduction from cell 102 through the bonding layer to a cell contact or to one or more traces at specific points (not shown). A selectively conductive bonding layer may also provide insulation between a cell contact and PCB 101. Other types of battery cell structures may also be used. Electrochemical cell 102 may take several forms. For example, cells may not be completely packaged, and may be similar to cells described in FIG. 1 and/or FIG. 3 of U.S. Patent Publication No. 2007/264564 (incorporated herein, in its entirety, by reference), or cells that are fully packaged, and may be similar, for example, to the cell described in FIG. 20 of U.S. Patent Publication No. 2008/261107 (incorporated herein, in its entirety, by reference).

Figure 5A:
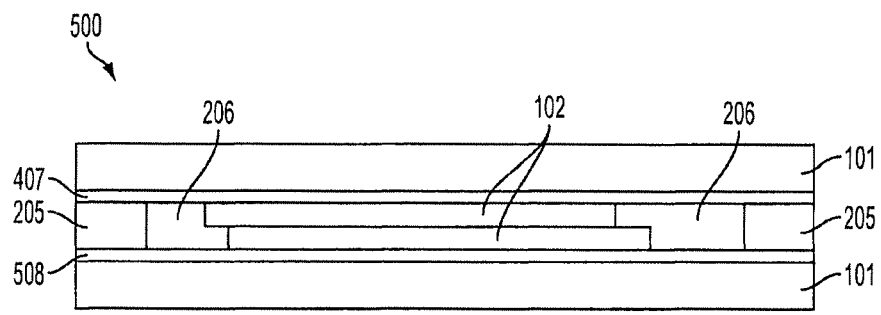
FIG. 5A shows a side cross-sectional view of an exemplary embodiment of the present invention including an electrochemical cell with electrically conducting layers on the top and the bottom of the cell and in contact with the insulating layers of the PCB.
Figure 5B:
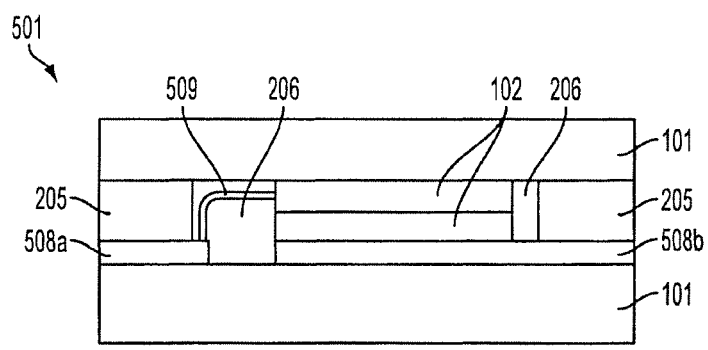
FIG. 5B shows a side cross-sectional view of an exemplary embodiment of the present invention including an electrochemical cell with an electrically conducting layer split into two portions, one portion on the bottom of the cell and the second portion electrically connected to the electrochemical cell by wire bonding.
Figure 5C:
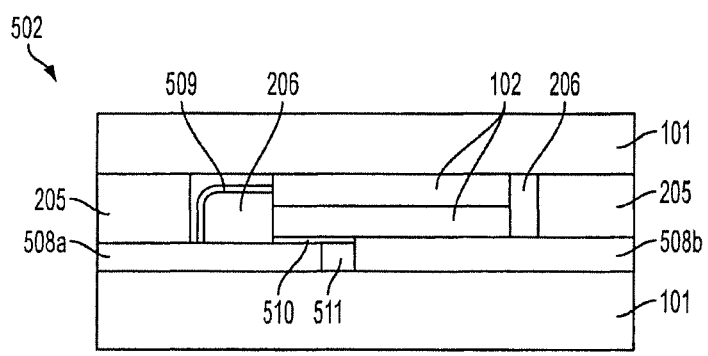
FIG. 5C shows a side cross-sectional view of an exemplary embodiment of the present invention including an electrochemical cell with an electrically conducting layer split into two portions on the bottom of the cell, one portion in contact with the cell and the second portion physically insulated from the cell but electrically connected to the electrochemical cell by wire bonding.

FIGS. 5A, 5B and 5C show various alternative exemplary embodiments of the present invention, device 500. FIG. 5A shows an example embodiment of the present invention that includes an electrochemical cell 102 with a second embedded conductor 508 that selectively creates an electrical contact between a first or second contact (not shown) and PCB 101. The conductive or insulating surface of PCB 101 may be selectively insulating between the contact points at which first embedded conductor 407 and second embedded conductor 508 meet PCB 101. Embedded conductors 407 and 508 may be externally accessible at the edges of PCB 101. Alternatively, embedded conductors 407 and 508 may not extend to the edges of PCB 101 and instead serve as PCB internal electrical interconnects. Exemplary embodiments of the present invention may also include more than two, for example three, four, five, six, seven, eight or more, embedded conductors.

FIGS. 5B and 5C show example embodiments of the present invention that include embedded conductor 508 and a second conductor in the form of micro wire bonding 509. FIG. 5B shows embedded conductor 508 split into two portions, conductor portions 508a and 508b. Conductor portion 508b is coupled with and electrically connected to electrochemical cell 102 and conductor portion 508a may be physically separated from electrochemical cell 102. Conductor portion 508a is selectively electrically connected to electrochemical cell 102 via wire bonding 509. However, conductor portion 508a may be electrically connected to electrochemical cell 102 via other methods, such as, for example, various other various metal conductors. FIG. 5C shows embedded conductor 508 split into portions 508a and 508b and conductor portion 508a extends, unlike in FIG. 5B, below electrochemical cell 102. Conductor portion 508a is physically separated from electrochemical cell 102 by insulator 510.

According to certain embodiments of the present invention, first embedded conductor 407 and second embedded conductor 508 may be, for example, placed within bonding layers in many different ways. For example, embedded conductors may consist of different materials such as a metal tab, a metal wire, a metal strip, a metal ribbon, multiple metal wires, multiple metal strips, multiple metal ribbons, a metal wire mesh, perforated metal foil, perforated metal, a metal coating applied to the adhesive layer, a metallic disk, a metallically coated fiberglass or combinations thereof may be used. First embedded conductor 407 and second embedded conductor 508 may provide electrical conduction between cell 102 and a cell contact. A bonding layer may provide insulation between the electrical contact and PCB 101. Embedded conductors 407 and 508 may be woven or placed within the bonding layer through slits, holes or other means. Embedded conductors 407 and 508 may be, for example, disks embedded within the bonding layer.

In another exemplary embodiment of the present invention, a reinforcement layer may be placed within the bonding layer. For example, a fiberglass material may cover half of one surface of the bonding layer, may be woven through the bonding layer and/or may cover the other half of the bonding layer. Such a layer of fiberglass without a conductive coating would insulate the electrochemical device and other materials. The fiberglass may be coated in a localized area with a conductive material. Such conductive coatings can coat the fiberglass area on the top and bottom surface of the bonding layer. The fiberglass may conduct between the upper contact and the cell. Conductive material may be disposed on the fiberglass using ink jet, silk screen, plasma deposition, e-beam deposition, spray and/or brush methods. The reinforcement layer may include materials other than fiberglass, such as, for example, Kevlar®, plastic or glass.

In another exemplary embodiment of the present invention, the electrical contact may have selective contact with the battery cell structure through holes in the bonding layer. The bonding layer and the battery cell structure may be, for example, pressed together to create a contact. Alternatively, the layers may make contact with one another by applying, for example, conductive glues or inks, solder, welding, wirebond, anisotropic conductive film or lithium in or near the hole in the bonding layer.

Embedded conductors 407 and 508 and/or the electrical contact may consist of, for example, gold, platinum, stainless steel, titanium, vanadium, chromium, manganese, iron, cobalt, nickel, copper zirconium, niobium, molybdenum, hafnium, tantalum, tungsten, aluminum, indium, tin, silver, carbon, bronze, brass, beryllium, or oxides, nitrides, carbides, and alloys thereof. The electrical contact may consist of a metal foil, stainless steel or any other metallic substance that has a requisite amount of conductivity. The metal foil may comprise a solderable alloy such as copper, nickel or tin. The electrical contact may be, for example, less than 100 microns thick, less than 50 microns thick or less than 25 microns thick.

Electrochemical cell 102 shown in exemplary embodiments of the present invention may include a cathode, an anode and an electrolyte. For example, the cathode may comprise $LiCoO_2$, the anode may comprise Lithium and the electrolyte may comprise LIPON. Other electrochemical devices may be used as needed.

Electrochemical cell 102 may be coupled with the interior layers or surfaces of PCB 101 in a number of ways. In an exemplary embodiment of the present invention, electrochemical cell 102, for example, may be coupled with the interior layers of PCB 101 using, for example, glue, solder, welding, wirebond or anisotropic conductive film. Glue may be any material that may adhere electrochemical cell 102 to PCB 101, such as cement glue or resin glue. Glue may create a mechanical and/or a chemical bond between electrochemical cell 102 to PCB 101. Glue may also include chemically bonding electrochemical cell 102 to PCB 101 without introducing another material or layer. Glue may be electrically conducting, semi-conducting or insulating.

In certain exemplary embodiments of the present invention, the interior layers of a PCB, including the conductive or insulating interior layer surface of PCB 101, act as a substrate for the electrochemical cell. Electrochemical cell 102 may be deposited or otherwise positioned on the layer surface of PCB 101. Electrochemical cell 102 may also be coupled to the interior layer surface of PCB 101 using, for example, glue, solder, welding, wirebond or anisotropic conductive film.

In an exemplary embodiment of the present invention, a $LiCoO_2$ cathode layer may be deposited on the interior layer of, for example, PCB 101. Deposition techniques known in the art include, but are not limited to, reactive or non-reactive RF magnetron sputtering, reactive or non-reactive pulsed DC magnetron sputtering, reactive or non-reactive DC diode sputtering, reactive or non-reactive thermal (resistive) evaporation, reactive or non-reactive electron beam evaporation, ion-beam assisted deposition, plasma enhanced chemical vapor deposition, spin coating, ink-jetting, thermal spray deposition and dip coating. As part of the fabrication process, for example, the cathode may be annealed using a thermal anneal at low temperatures (e.g. <400° C.), thermal anneal at high temperatures (e.g. >400° C.), rapid thermal anneal or by using convection furnaces. Another or an alternative post-deposition anneal may include laser annealing to improve the crystallization of the $LiCoO_2$ layer to fine-tune and optimize its chemical properties, such as its electrochemical potential, energy, power performance and reversible lattice parameters on electrochemical and thermal cycling.

Following deposition of the cathode layer, an electrolyte may be deposited on the cathode, followed by an anode, using any of many processes known to someone of ordinary skill in the art. A metal encapsulate layer may be formed on the electrochemical cell itself instead of using embedded conductor 407 and/or embedded conductor 508 as shown, for example, in FIG. 5. The metal encapsulate layer may be made of a metal foil, stainless steel or any other metallic substance with a requisite amount of conductivity. The metal foil may comprise a solderable alloy such as, for example, alloys of copper, nickel or tin.

Figure 6A:
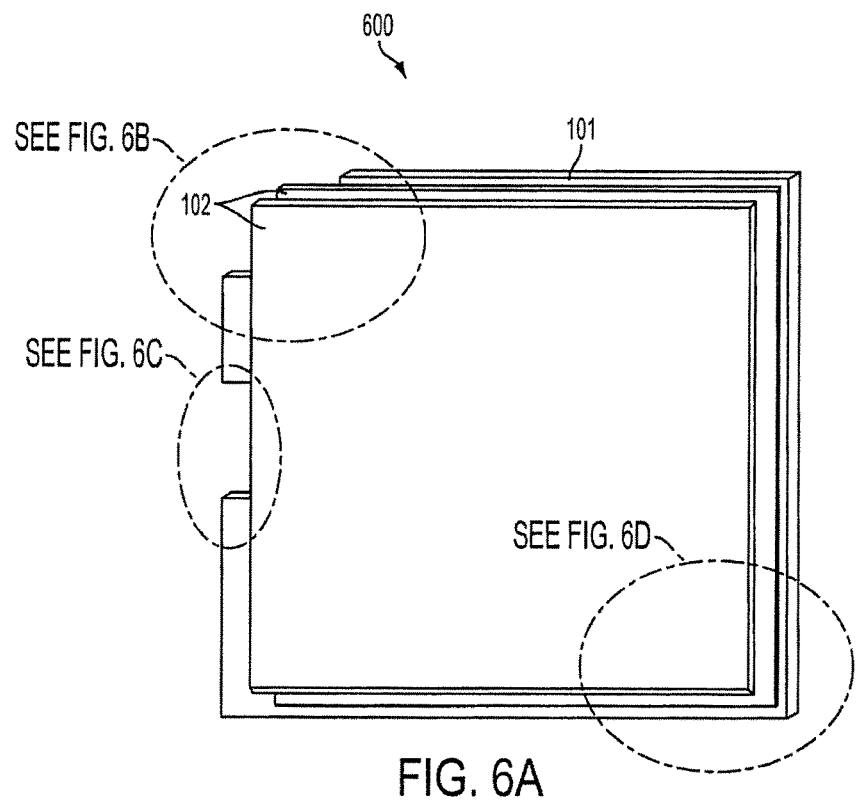
FIG. 6A shows a top down view of an exemplary embodiment of the present invention including a PCB and an embedded electrochemical cell.
Figure 6B:
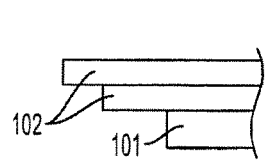
FIG. 6B shows an expanded side cross-sectional view of a portion of an exemplary embodiment of the present invention including a PCB with an embedded electrochemical cell that extends beyond an edge of the PCB.
Figure 6C:
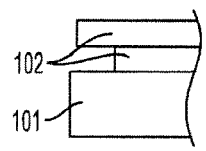
FIG. 6C shows an expanded side cross-sectional view of a portion of an exemplary embodiment of the present invention including a PCB with an embedded electrochemical cell that is flush with an edge of the PCB.
Figure 6D:
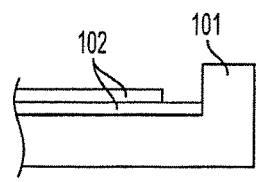
FIG. 6D depicts a side expanded cross-sectional view of a portion of an exemplary embodiment of the present invention including a PCB and an embedded electrochemical cell with a portion of the PCB removed to expose a portion of the cell.
Figure 7A:
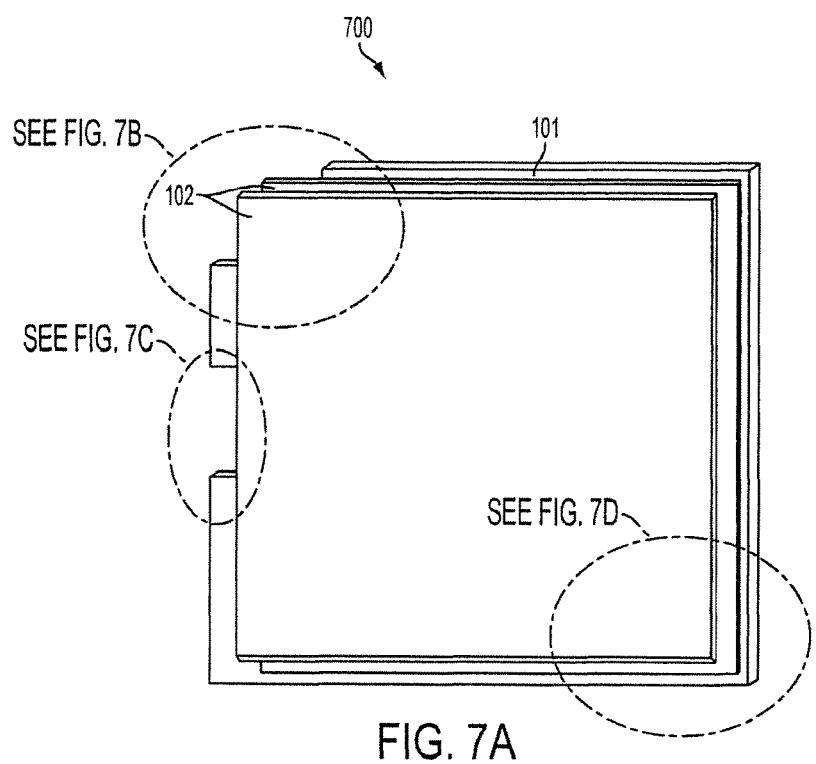
FIG. 7A shows a top down view of an exemplary embodiment of the present invention including a PCB and an embedded electrochemical cell and a conducting layer between the electrochemical cell and the PCB.
Figure 7B:
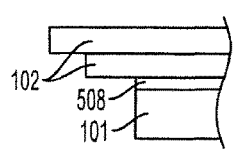
FIG. 7B shows an expanded side cross-sectional view of a portion of an exemplary embodiment of the present invention including a PCB and an embedded electrochemical cell and a conductor on the PCB with an edge of the cell extending beyond the edge of a PCB.
Figure 7C:
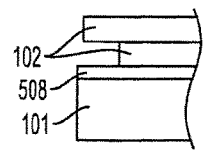
FIG. 7C shows an expanded side cross-sectional view of a portion of an exemplary embodiment of the present invention including a PCB and an embedded electrochemical cell and a conducting layer between the electrochemical cell and the PCB with a portion of the PCB removed to form a gap or space.
Figure 7D:
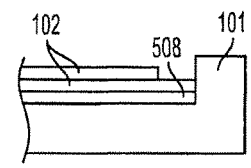
FIG. 7D depicts a side expanded cross-sectional view of a portion of an exemplary embodiment of the present invention including a PCB and an embedded electrochemical cell and a conducting layer between the electrochemical cell and the PCB with a portion of the PCB removed to expose a portion of the cell.

FIGS. 6A, 6B, 6C and 6D show various alternative exemplary embodiments of the present invention, device 600. Device 600 includes an example embodiment of the present invention that includes electrochemical cell 102 embedded on PCB 101. FIG. 6B, for example, shows electrochemical cell 102 extending beyond an edge of PCB 101. FIG. 6C shows the top layer of electrochemical cell 102 flush with an edges of PCB 101. Furthermore, unlike, for example, device 100, an embodiment may not include a PCB layer over an electrochemical cell, for example, a micro-energy cell (MEC). Certain exemplary embodiments may include an open PCB or extended openings in a layer of the PCB. FIG. 6D, for example, shows a space in the PCB so that a portion or the entire surface of the PCB is exposed.

FIGS. 7A-7D show various alternative exemplary embodiments of the present invention, device 700. Device 700 includes conductor 508 on PCB layer 101 with an embedded MEC. PCB 101 may include traces and components on one or both of its sides. These exemplary embodiments may also include, for example, open PCB structures as shown in FIGS. 6A-6D.

Figure 8A:
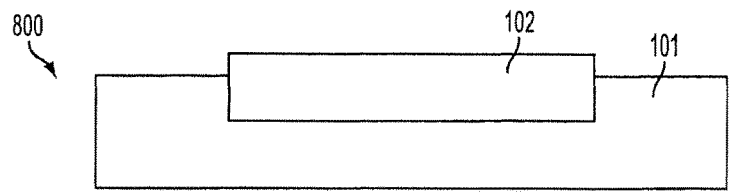
FIG. 8A provides a cross-sectional view of an exemplary embodiment of the present invention including a PCB and an electrochemical cell and a portion of the cell is embedded within the PCB and a portion of the cell is externally accessible.
Figure 8B:
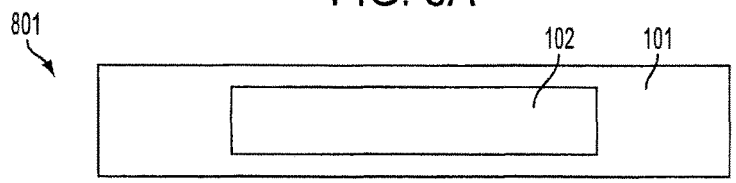
FIG. 8B provides a cross-sectional view of an exemplary embodiment of the present invention including an electrochemical cell wholly embedded within a PCB.
Figure 8C:
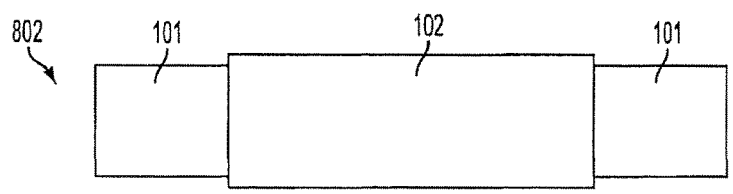
FIG. 8C provides a cross-sectional view of an exemplary embodiment of the present invention including a PCB with an electrochemical cell externally accessible from more than one side of the PCB.
Figure 8D:
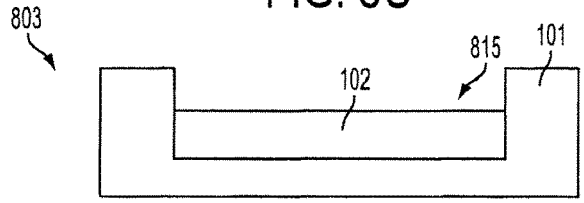
FIGS. 8D, 8E, 8F, 8G, 8H, 8I, 8J and 8K provide exemplary embodiments of the present invention with an electrochemical cell embedded in a PCB.
Figure 8E:
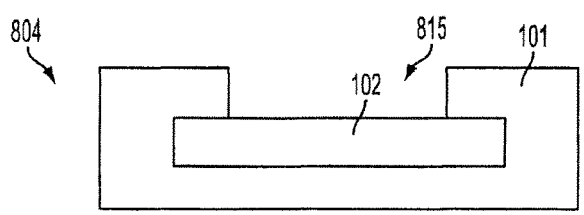
Figure 8F:
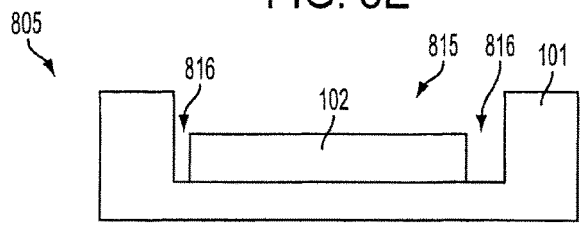
Figure 8G:
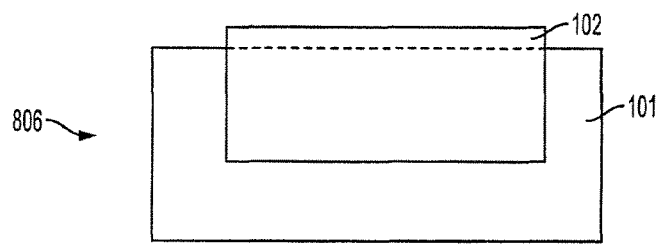
Figure 8H:
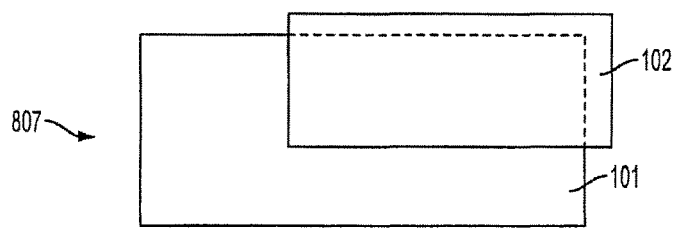
Figure 8I:
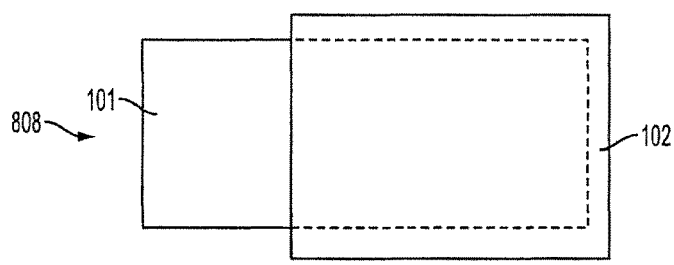
Figure 8J:
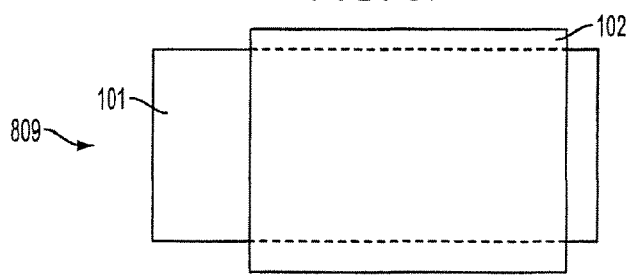
Figure 8K:
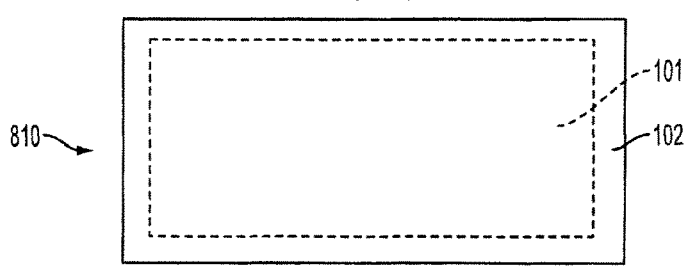

FIGS. 8A-8K show various alternative exemplary embodiments of the present invention, device 800. FIG. 8A is a cross-sectional view and shows electrochemical cell 102 placed so that a portion of cell 102 is embedded within PCB 101 and a portion of cell 102 is externally accessible. FIG. 8B is a cross-sectional view and shows electrochemical cell 102 wholly embedded within PCB 101. FIG. 8C is a cross-sectional view and shows electrochemical cell 102 externally accessible from more than one side of PCB 101. Electrochemical cell 102 may, for example, extend from the PCB on three or four sides. FIG. 8D is a cross-sectional view and shows PCB 101 with an open structure such that electrochemical cell 102 may be externally accessible from the top of PCB 101 through PCB opening 815. FIG. 8E is a cross-sectional view and shows that opening 815 of PCB 101 may be less wide than the width of electrochemical cell 102. PCB 101 extends over portions of the ends of cell 102 such that cell 102 is partially embedded within the ends of PCB 101. FIG. 8F is a cross-sectional view and shows that opening 815 of PCB 101 may be wider than the width of electrochemical cell 102. Electrochemical cell 102 may be placed within opening 815 in PCB 101 such that the ends of cell 102 do not contact PCB 101, creating gaps 816 between cell 102 and PCB 101. Electrochemical cell 102 and PCB 101 may be connected in various alternative configurations, examples of which are shown in FIGS. 8G-8K and which are in plain view format.

Exposed surfaces of portions of an embedded cell, as in various exemplary embodiments of the present invention, which otherwise may provide an access port or peep hole, may be filled in and/or covered with insulating material or with conductive material that is subsequently covered with insulating material or an insulating layer. The hole or void may be covered or filled to reduce or eliminate direct external access to the cell.

Electrochemical devices other than those shown in the various exemplary embodiments of the present invention shown in FIGS. 1A-8K may be used as needed. Electrochemical devices may also include, for example, an encapsulate that may comprise a ceramic-metal composite laminate, which may include a multiple of alternating layers of Zirconium Nitride and Zirconium or Titanium Nitride and Titanium.

Examples of methods used to deposit $LiCoO_2$ are disclosed in U.S. Patent Publication No. 2007/0125638, which is incorporated herein by reference in its entirety.

The layers of PCBs in various exemplary embodiments of the present invention, including the conductive or insulating surfaces of the PCBs, may be part of any integrated circuit that may include memory devices, processors or other logic circuits.

PCBs in various exemplary embodiments of the present invention may include a flexible circuit board which may include, for example, multiple circuit board layers. The multiple circuit board layers may include or not include traces, single or double sided, semi-rigid, a film and/or a polyimide film, such as, for example, Kapton®.

In certain embodiments of the present invention, the layers of PCBs in various exemplary embodiments of the present invention may act as an encapsulate for the electrochemical cell such as, for example, a thin film battery.

Exemplary embodiments of the present invention may also include multiple electrochemical devices stacked upon each other, multiple PCBs stacked upon each other and/or multiple layers within a PCB having either conductive or insulating surfaces or layers.

Exemplary embodiments of the present invention may also include multiple electrochemical devices stacked upon electrical contacts.

Exemplary embodiments of the present invention provide alternative methods to encapsulate the chemically and mechanically sensitive layers of electrochemical devices. Exemplary embodiments of the present invention also avoid problems related to temperature changes causing the gas within the metal and plastic pouches encapsulating the electrochemical device to expand and/or contract and the seals of the metal and plastic pouches from blowing out.

Exemplary embodiments of the present invention also provide a rechargeable secondary battery directly fabricated within one or more PCBs. Such batteries provide power during times when the circuit is powered off and are quickly and easily recharged when power resumes. Critical circuitry may benefit from localized power provided by such batteries. The exemplary embodiments also provide for less expensive and more reliable encapsulation and better approaches to providing electrically conductive contacts, including encapsulation that is substantially thinner than known encapsulation methods. The exemplary embodiments also provide flexible integrated circuits and/or flexible printed circuit hoards with thin film flexible batteries coupled thereon.

The electrochemical device may comprise a discrete device (e.g., fully packaged with its own substrate and own encapsulation) in a PCB. For example, prior to its integration into the PCB, the electrochemical device may be fabricated as a discrete device, and then integrated into the PCB with its substrate and encapsulation as a whole.

Embodiments of the present invention described herein are exemplary only. One skilled in the art may recognize variations from the embodiments specifically described herein, which are intended to be within the scope of this disclosure. As such, the invention is limited only by the following claims. The present invention covers such variations provided that they come within the scope of the appended claims and their equivalents.

The invention claimed is:

1. A printed circuit board comprising:
 a printed circuit board (PCB) layer stack having two outer electrically insulating layers, with conductor traces being formed on an outer surface of one or both of said two outer electrically insulating layers;
 an electrochemical cell inserted in said PCB layer stack between said two outer electrically insulating layers of the PCB layer stack, wherein said electrochemical cell is in direct contact with each of said two outer electrically insulating layers of said PCB layer stack;
 a spacer between the two outer electrically insulating layers; and
 a void space provided in a gap located at an edge of said electrochemical cell, the gap of the void space directly defined by the spacer, said electrochemical cell and the two outer electrically insulating layers.

2. The printed circuit board of claim 1, wherein the spacer is a different material than materials of both of the two outer electrically insulating layers of the PCB layer stack and is a different material than any material of the electrochemical cell.

3. The printed circuit board of claim 1, wherein said spacer connects one of said two outer electrically insulating layers of the PCB layer stack to the other of said two outer electrically insulating layers of the PCB layer stack.

4. The printed circuit board of claim 1, further comprising an embedded conductor in electrical connection with said electrochemical cell, said embedded conductor being externally accessible at an edge of at least one of the two outer electrically insulating layers of the PCB layer stack.

5. The printed circuit board of claim 1, wherein the PCB layer stack is planar.

6. A printed circuit board comprising:
 a printed circuit board (PCB) layer stack having a plurality of layers which include two outer electrically insulating layers;
 wherein at least one of the two outer electrically insulating layers of the PCB layer stack comprises an insulator material disposed in an epoxy material;
 an electrochemical cell embedded between said two outer electrically insulating layers of said PCB layer stack;
 two spacers between the two outer electrically insulating layers;
 a conductive layer extending along a surface of one of the two outer electrically insulating layers and in direct contact with the electrochemical cell and each of the two spacers, the conductive layer externally accessible between the one of the two outer electrically insulating layers and a respective spacer; and
 two gaps of void space located at two edges of said electrochemical cell, the two gaps of void space defined by a respective spacer, said electrochemical cell, another of the two outer electrically insulating layers, and the conductive layer.

7. The printed circuit board of claim 6, wherein the two spacers are each a different material than materials of both of the two outer electrically insulating layers of the PCB layer stack and are each a different material than any material of the electrochemical cell.

8. The printed circuit board of claim 6, further comprising a wire bond, wherein said conductive layer is in electrical connection with said electrochemical cell through said wire bond.

9. A printed circuit board comprising:
 a printed circuit board (PCB) layer stack having two outer electrically insulating layers, with conductor traces being formed on an outer surface of one or both of said two outer electrically insulating layers;
 an electrochemical cell inserted in said PCB layer stack directly between and in contact with said two outer electrically insulating layers of the PCB layer stack, wherein said electrochemical cell is embedded between said two outer electrically insulating layers of said PCB layer stack; and a gap of space located at an edge of the electrochemical cell, the gap of space defined only by the electrochemical cell and the two outer electrically insulating layers that wrap around the electrochemical cell until the two outer electrically insulating layers contact each other to seal the gap of space and the electrochemical cell.

* * * * *